United States Patent [19]
Ueyama et al.

[11] Patent Number: 4,764,416
[45] Date of Patent: Aug. 16, 1988

[54] ELECTRIC ELEMENT CIRCUIT USING OXIDATION-REDUCTION SUBSTANCES

[75] Inventors: Satoshi Ueyama; Satoru Isoda; Osamu Tomisawa; Akemi Ogura; Hiroaki Kawakubo, all of Hyogo, Japan

[73] Assignee: Mitsubishi Denki Kabushiki Kaisha, Tokyo, Japan

[21] Appl. No.: 68,298

[22] Filed: Jul. 1, 1987

[30] Foreign Application Priority Data

Jul. 1, 1986 [JP] Japan .............................. 61-155454
Jul. 11, 1986 [JP] Japan .............................. 61-164184
Jul. 11, 1986 [JP] Japan .............................. 61-164185

[51] Int. Cl.$^4$ ..................... B32B 9/04; B32B 15/04
[52] U.S. Cl. ................................. 428/212; 427/35; 427/36; 427/43.1; 427/54.1; 428/432; 428/459; 428/478.2
[58] Field of Search ............... 427/35, 36, 43.1, 54.1; 428/212, 432, 459, 478.2

[56] References Cited

U.S. PATENT DOCUMENTS

| | | | |
|---|---|---|---|
| 3,966,580 | 6/1976 | Janata et al. | 428/478.2 |
| 4,032,901 | 6/1977 | Levinthal | 365/167 |
| 4,103,064 | 7/1978 | McAlear et al. | 428/459 |
| 4,103,073 | 7/1978 | McAlear et al. | 428/459 |
| 4,541,908 | 9/1985 | Niki et al. | 428/414 |
| 4,613,541 | 9/1986 | Isoda | 428/459 |

*Primary Examiner*—William J. Van Balen
*Attorney, Agent, or Firm*—Sughrue, Mion, Zinn, Macpeak, and Seas

[57] ABSTRACT

The present invention relates to a redox electric element circuit formed by using oxidation-reduction substance such as electron-transport protein or the like. Oxidation-reduction substance arranged between redox electric elements and the like is inactivated by energy beam irradiation to form insulating matter, so that wirings and element separation structure are established between redox electric elements and the like.

16 Claims, 5 Drawing Sheets

- ⊞ FLAVODOXIN
- ○ CYTOCHROME C
- ⊠ CYTOCHROME $C_3$
- ☐ INACTIVATAL CYTOCHROME $C_3$ (INSULATOR)

ELECTRIC ELEMENT CIRCUIT USING OXIDATION-REDUCTION SUBSTANCES

BACKGROUND OF THE INVENTION

The present invention relates to wirings and element separation structure in the field of integrated circuit, and more particularly, relates to wirings and separation structure employed in redox electric element circuits formed by using oxidation reduction substances.

Heretofore, electric elements, for example, rectifier elements in metal-oxide-semiconductor (MOS) structure as shown in FIG. 1, have been employed in conventional integrated circuits. In FIG. 1, the reference numeral 11 designates a p-type silicon substrate, the reference numeral 12 designates an n-type region, the reference numeral 13 designates a p-type region, the reference numeral 14 designates an n-type region, the reference numeral 15 designates $SiO_2$ films, and the reference numerals 16 and 17 designate electrodes. As shown in FIG. 1, a p-n junction is formed between the electrodes 16 and 17 (by the junction of the p-type region 13 and the n-type region 14), thereby attaining rectifying characteristics.

The conventional rectifier elements in the MOS structure can be hyperfinely processed, whereby LSIs of 1 Mbits employing the rectifier elements in the aforementioned structure or transistor elements in similar structure thereto are now put into practice.

In order to improve such elements in storage capacity and in arithmetic speed, the elements themselves must indispensably be in hyperfine structure, whereas mean free paths of electrons are substantially equalized to scales of the elements in hyperfine patterns of about 0.2 $\mu m$ in elements using Si and hence the independency of the elements cannot be maintained. Thus, it is anticipated that maturing silicon technology may run into a blank wall in the view of hyperfine structure in the near feature, and hence required is an electric circuit element based on a new principle which can crack the 0.2 $\mu m$ barrier.

To cope with the aforementioned problem, the applicant of this application has developed and disclosed an electric element which is implemented in hyperfine size in biomolecular level by using biomaterials as constituent members of the electric element. The details of the element is disclosed in U.S. Pat. No. 4,613,541 (or West German Patent Unexamined Publication DE No. 3600564A1).

The disclosed electric element (hereinafter called "redox electric element") will be briefly described hereunder.

A rectifier element having rectifying characteristics similar to those of a p-n junction type semiconductor and a transistor element having transistor characteristics similar to those of a p-n-p junction type transistor are developed by utilizing redox (oxidation-reduction) potential difference between two or more types of electron-transport proteins which are present in vivo and act to transport electrons through oxidation-reduction reaction. Thus, the elements are implemented in hyperfine size in biomolecular level, thereby attaining a high-speep circuit of high density.

Further, the inventors of this application have developed other elements, such as resistors, capacitors and the like, having a good affinity for the aforementioned elements in order to form a redox electric element circuit employing the aforementioned elements. However, wirings to electrically connect such elements to one another in an element circuit has not yet been studied.

SUMMARY OF THE INVENTION

Therefore, a first object of the present invention is to provide a redox electric element circuit having wirings having a good affinity for respective redox electric elements.

In general, integrated circuits require separation regions for separating one element from the other adjacent elements. Similarly, integrated circuits employing redox electric elements as described above also require element separation regions. Further, the separation regions must have a good affinity for materials constituting such redox electric elements.

Therefore, another object of the present invention is to provide an element separation structure effectively applied to such redox electric element circuits.

These objects can be achieved by the redox electric element circuit according to the present invention which comprises a plurality of redox electric elements formed by using oxidation-reduction substances, a plurality of electrodes connected to the electric elements, wirings arranged in at least one of places between the electric elements and between the electric elements and the electrodes, and insulating matters arranged in at least one of places between the electric elements, between the electric elements and the wirings and between the wirings, the insulating matters being formed of oxidation-reduction substance inactivated by irradiation of an energy beam.

DETAILED DESCRIPTION OF THE INVENTION

In general, oxidation-reduction substances, such as electron-transport protein or the like, is inactivated by irradiation of an energy beam so that the substance loses its electron transport function and becomes an insulating matter. The present invention is based on this phencmenon, and a subject thereof is in that oxidation-reduction substance arranged between redox electric elements and the like is inactivated by irradiation of an energy beam to form an insulating matter and thus to form wirings and element separation structure.

According to the present invention, an insulating matter can be arranged by inactivating oxidation-reduction substance, thereby attaining wirings and element separation structure in good affinity for redox electric elements employing oxidation-reduction substance and and in biomolecular level.

An embodiment of the present invention will be described in detail with reference to the accompanying drawings.

First, before description of the redox electric element circuit in accordance with the present invention, the aforementioned redox electric elements will be described, viz., rectifier elements, switching elements, resistor elements and capacitor elements.

Figure 1:
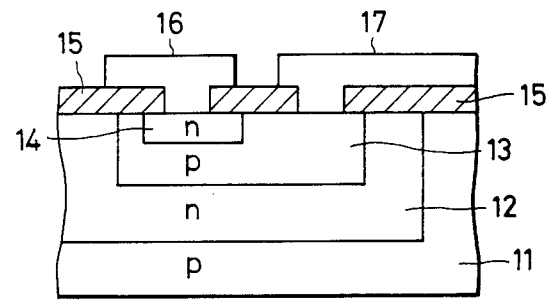
FIG. 1 is a sectional view showing a conventional rectifier element in MOS structure.
Figure 2A:
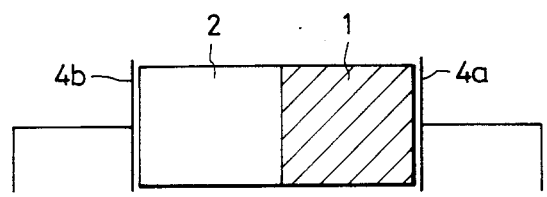
FIG. 2(A) is a typical view showing a rectifier element according to this invention.
Figure 2B:
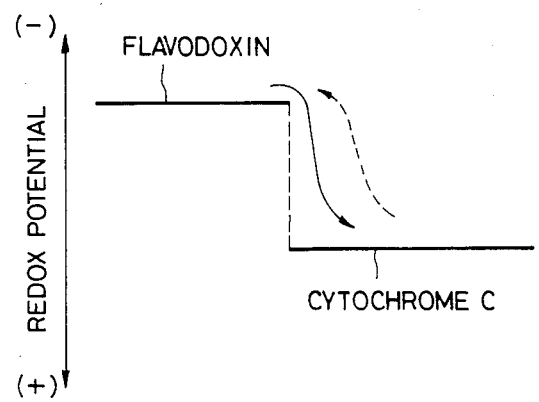
FIG. 2(B) is a diagram showing redox potential states of FIG. 2(A)

A rectifier element according to this invention is formed, as shown in FIG. 2(A), by sticking and joining two types of electron-transport proteins which are different in redox (oxidation-reduction) potential from each other, for example, by sticking and joining a cytochrome c molecule 1 and a flavodoxin molecule 2 with each other. Because the redox potentials of cytochrome c 1 and flavodoxin 2 are different in redox potential as shown in FIG. 2(B) this element has rectifying characteristics so that electrons can easily flow from the negative redox potential level to the positive redox potential level in the direction of the solid-line arrow as shown in the drawing (hereinafter called "positive direction") while electrons hardly flow in the reverse direction (as shown by the broken-line arrow in the drawing). Accordingly, the rectifying characteristics of the element are similar to those of a p-n junction diode formed by joining an n-type semiconductor and a p-type semiconductor. In the drawing, the reference numerals 4a and 4b designate electrodes for applying a voltage V to the element in the case where the element is used as a rectifier element.

Figure 3:
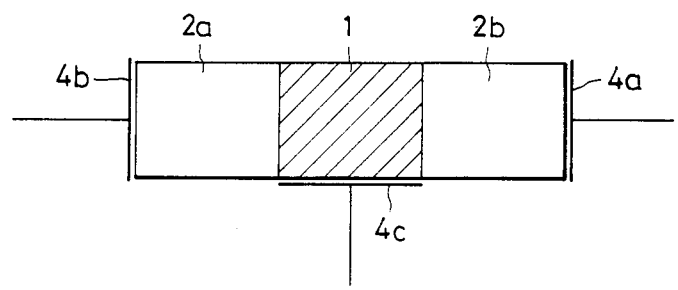
FIG. 3 is a typical view showing a switching element according to this application.

Further, a switching element according to this invention is formed, as shown in FIG. 3, by using three electron-transport proteins 2a, 1 and 2b of two or more types which are different in redox potential. That is, the switching element is formed as a transistor element having similar characteristics to those of a conventional transistor element formed of a p-n-p junction semiconductor. In FIG. 3, the reference numerals 4a, 4b and 4c designates electrodes.

Further, for example, a resistor according to this invention is formed by arranging between a pair of electrodes an electron-transport complex or a plurality of electron-transport complexes composed of two types of electron-transport proteins employed in the aforementioned rectifier element. In the case where a plurality of electron-transport complexes are employed in the resistor element, the complexes are arranged in series between a pair of electrodes so that electron-transport paths are established in parallel. Further, for example, a capacitor element is formed by arranging the aforementioned electron-transport complex between a pair of electrodes so that the electrodes and electron-transport paths are established in parallel or it is formed by arranging between a pair of electrodes protein molecules having no electron-transport function.

Figure 4:
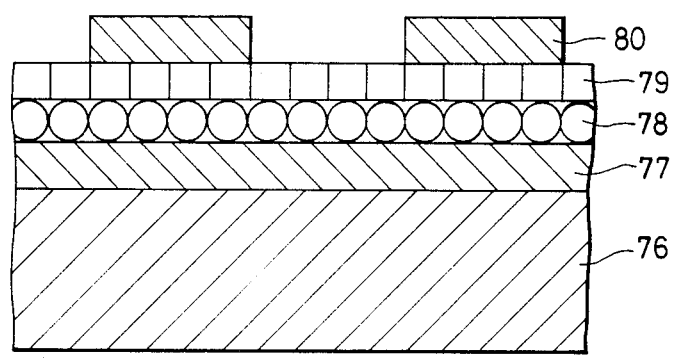
FIG. 4 is a typical sectional view showing a rectifier element according to this invention.

The practical structure of the aforementioned rectifier element is as shown in FIG. 4. In FIG. 4, the reference numeral 76 designates a substrate having insulating characteristics, and the reference numeral 77 designates a plurality of electrodes of metal such as Ag, Au, Al or the like. The plurality of electrodes 77 are formed parallelly to each other on the substrate 76. The reference numeral 78 designates a first electron-transport protein film made for cytochrome c by a method such as the LB (Langmuir-Blodgett) method, and the reference numeral 79 designates a second electron-transport protein film made of flavodoxin by a method such as the LB method. the second electron-transport protein film 79 is accumulatedly stuck and joined to the first electron-transport protein film 78. The reference numeral 80 designates a plurality of parallel electrodes formed on the second electron transport protein film 79 so that parallel electrodes 80 are perpendicular to the parallel electrodes 77.

Figure 5:
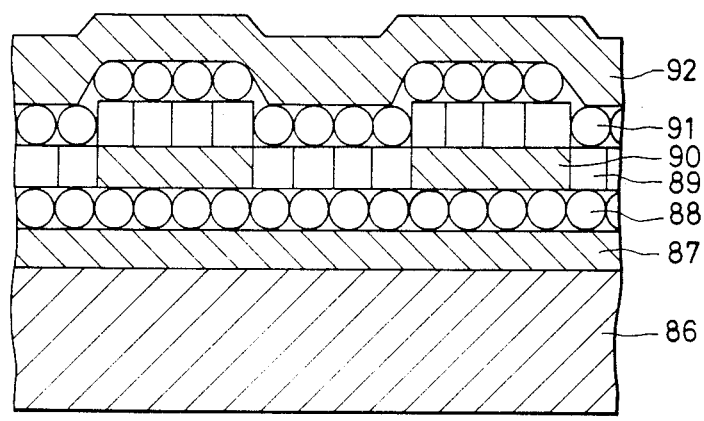
FIG. 5 is a typical sectional view showing a switching element according to this invention.

The practical structure of the aforementioned switching element is as shown in FIG. 5.

In FIG. 5, the reference numeral 86 designates a substrate having insulating characteristics, and the reference numeral 87 designates a plurality of electrodes of metal such as Ag, Au, Al or the like. The plurality of electrodes 87 are formed parallely to each other on the substrate 86. the reference numeral 88 designates a first electron-transport protein film made of flavodoxin by a method such as the LB method. The first electron transport protein film 88 is formed on the electrodes 87. The reference numeral 90 designates a plurality of parallel electrodes formed on the first electron-transport protein film 88 so that the parallel electrodes 90 are perpendicular to the parallel electrodes 87. The reference numeral 89 designates a second electron-transport protein film made of cytochrome c by a method such as LB method, similarly. The second electron-transport protein film 89 is accumulatedly stuck and joined to the first electron-transport protein film 88 and joined to the electrodes 90. The reference numeral 91 designates a third electron-transport protein film made of flavodoxin by a method such as the LB method, similarly. the third electron-transport protein film 91 is accumulatedly stuck and joined to the second electron-transport protein film 89. The reference numeral 92 designates a plurality of parallel electrodes formed on the third electron-transport protein film 91 so that the parallel electrodes 92 are perpendicular to the parallel electrodes 90.

Figure 6A:
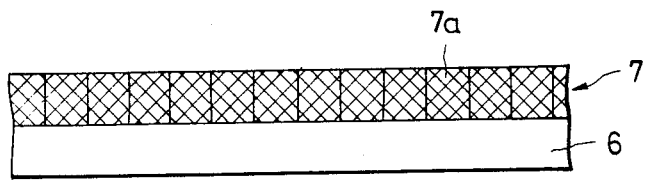
FIGS. 6(A) to 6(E) are typical diagrams showing steps of a process for producing a redox electric element circuit according to an embodiment of the present invention.
Figure 6B:
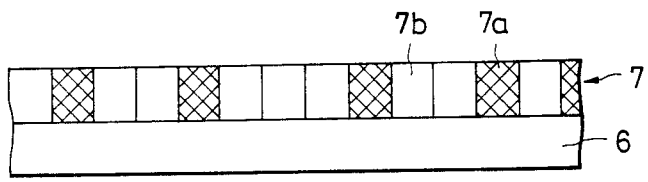
Figure 6C:
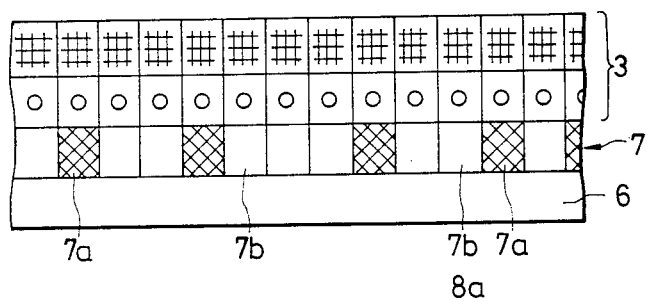
Figure 6D:
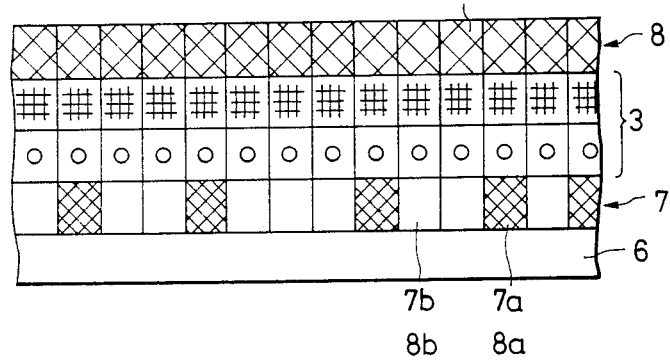
Figure 6E:
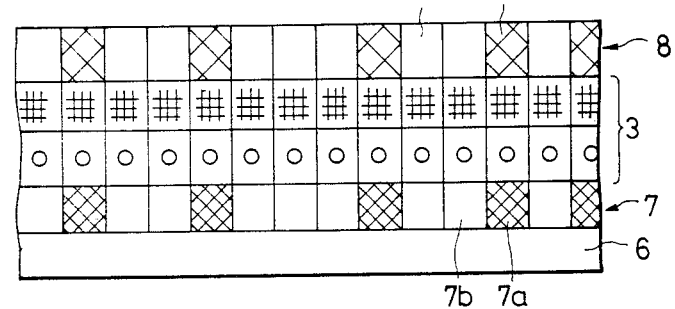

FIG. 6(E) shows a redox electric element circuit according to an embodiment of the present invention, in which the reference numeral 6 designates a substrate, and the reference numeral 7 designates a first wiring (electrode) layer formed on the substrate 6 and composed of protein molecules 7a and 7b. The protein molecules 7a and 7b are cytochrome $c_3$ molecules and inactive cytochrome $c_3$, respectively. The former molecules 7a function as conductive protein capable of transporting electrons in all directions, and the latter molecules 7b function as an insulating matter which is prepared by inactivating the conductivity of cytochrome $c_3$ (7a) by irradiation of an energy beam such as an electron beam, an ion beam, a molecular beam, an elementary particle beam, an X-ray beam, a gamma-ray beam or an ultraviolet (UV) beam. The reference numeral 3 designates a redox electric element layer made of biomaterials or pseudo-biomaterials to attain rectifying characteristics, switching characteristics and the like. The reference numeral 8 designates a second wiring (electrode) layer formed on the redox electric element layer 3 and composed of protein molecules 8a and 8b. the protein molecules 8a and 8b are cytochrome c3 and inactive cytochrome c3, respectively. the former 8a functions as conductive protein, and the latter 8b functions as an insulating matter which is prepared by inactivating the conductivity of cytochrome c3 (8a) by irradiation of an energy beam in the same manner as described above.

The process of producing the circuit of this embodiment will be described hereunder with reference to FIGS. 6(A) through 6(E).

First, a film of cytochrome c3 (7a) is formed on the substrate 6 to thereby prepare a first wiring layer 7 (FIG. 6(A)). Newt, in order to attain a necessary patter of cytochome c3 (7a) is partly irradiated by an energy beam, such as an electron beam, an ion beam, an X-ray beam, an UV beam or the like, so that the conductivity of cytochrome c3 (7a) is partly lost to thereby prepare inactive cytochrome c3 (7b) (FIG. 6(B)). Next, a redox electric element layer 3 is formed on the first wiring layer 7 (FIG. 6(C)), and then a second wiring layer 8 of cytochrome c3 (8a) is formed thereon (FIG. 6(D)). Finally, in the second wiring layer 8, the same pattern of wiring as that of the first wiring layer 7 is formed by irradiation of an energy beam such as an ion beam or the like in the same manner as that described above for the first wiring layer 7 (FIG. 6(E)).

In the redox electric element circuit in the aforementioned structure, wiringts (or electrodes) are made of the same protein material as used for the redox electric element layer, so that the elements have a good affinity for each other. Further, the elements are of hyperfine size in molecular level, so that a bioelectric element circuit of high density and high speed can be attained.

Although the aforementioned embodiment has shown the case where cytochrome c3 is used as a protein for forming wiring layers, other proteins or other pseudobiomaterials may be used as long as they are capable of transporting electrons in all directions and have conductivity as can be lost artificially.

Figure 7A:
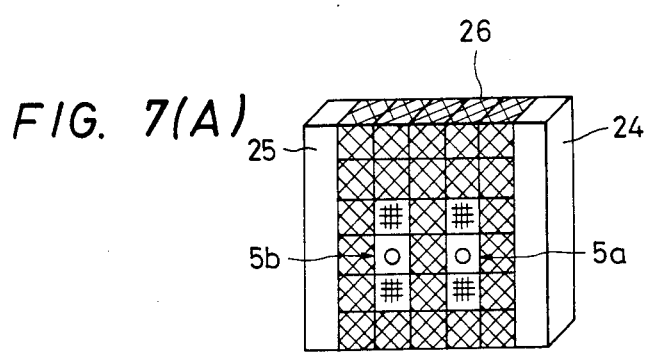
FIGS. 7(A) to 7(C) are views showing the typical structure and production process of a redox electric element circuit employing wirings and element structure according to another embodiment of the present invention.
Figure 7B:
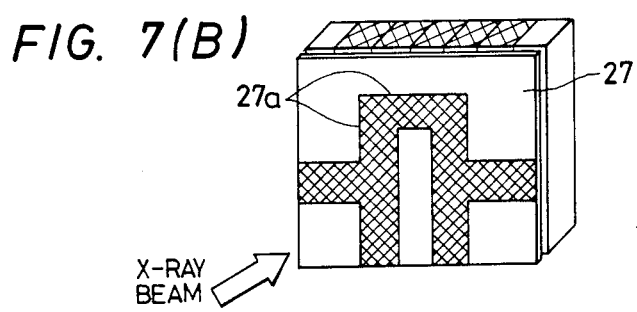
Figure 7C:
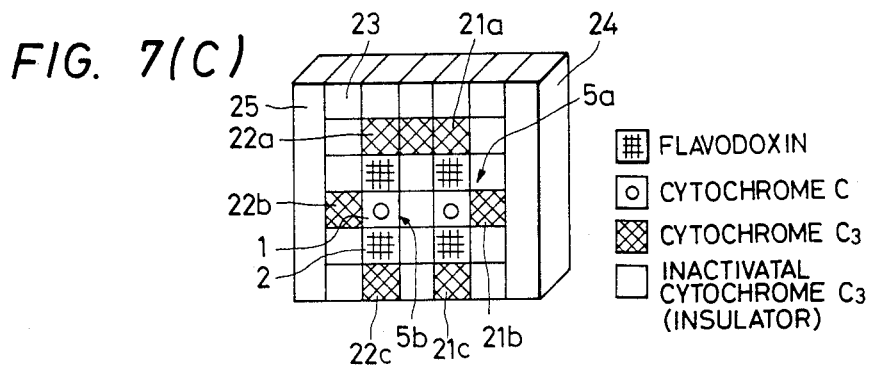

FIG. 7(C) shows a redox electric element circuit having wirings and separation structure according to another embodiment of the present invention. In the drawing, each of the reference numerals 5a and 5b designates a transistor element, for example, which is composed of one unit of cytochrome c 1 and two units of flavodoxin 2, the reference numerals 21a to 21c designate electrode terminals (wirings) of the transistor element 5a which terminals are made of cytochrome c3, the reference numerals 22a to 22c designate electrode terminals (wirings) of the transistor element 5b which terminals are made of cytochrome c3, and the reference numeral 23 designates an insulating matter formed by inactivating cytochrome c3. The reference numeral 24 designates a wiring made of cytochrome c3 and connecting the electrode terminals 21a and 22a to each other. The reference numerals 24 and 25 designate electrodes of metal such as Au, Pt, Al or the like. The electrode 24 is connected to the transistor electrode terminal 21b, and the electrode 25 is connected to the transistor electrode terminal 22b. Both cytochrome c and flavodoxin molecules constructing the transistor elements 5a and 5b are electron-transport proteins having electron-transport functions for carrying electrons in predetermined direction, and both molecules are stuck and joined to each other so as to be oriented in a specific arrangement.

The operation and effect of this embodiment will be described hereunder with reference to the production process. FIGS. 7(A) to 7(C) are perspective views showing the process of producing the redox electric circuit employing wirings and element separation structure according to the aforementioned embodiment, in which the two transistors 5a and 5b are separated by the insulating matter formed by inactivating conductive protein to thereby attain wirings.

For example, as shown in FIG. 7(A), two transistor elements 5a and 5b are prepared by cytochrome c and flavodoxin. Cytochrome c3 (26) is arranged to surround the transistor elements 5a and 5b. At this point of time, the cytochrome c3 has an electron transport function for carrying electrons in all directions. Next, the protein film is irradiated by an X-ray beam through a mask 27 which has a predetermined beam-shielding pattern so that the transistor elements 5a and 5b and the electrode terminals thereof cannot be irradiated by an X-ray beam. The part of cytochrome c3 irradiated by X-ray beam is inactivated to thereby lose the conductivity thereof. Although irradiation by an X-ray beam through a mask has been described, suck irradiation by an X-ray beam may be directly made by scanning without masking cytochrome c3 to thereby inactivate cytochrome c3 in a necessary patter.

Figure 8:
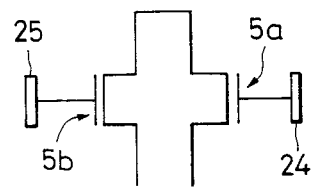
FIG. 8 is a circuit diagram equivalent to the redox electric element circuit as shown in FIG. 7.

Consequently, as shown in FIG. 7(C), the two transistor elements 5a and 5b are insulated from each other by cytochrome c3 (23) thus inactivated as an insulating matter, and the terminals 21a to 21c and 22a to 22c of the transistor elements 5a and 5c are not shorted but isolated from one another. FIG. 8 is a diagram of a circuit equivalent to that of FIG. 7(C).

The use of wirings and element separation structure according to this embodiment makes it possible that the conductive protein employed in redox electric element, terminals thereof and the like is arranged in an arbitrary place, and thus that a redox electric element circuit of super-high density is put into practice. Further, the insulating matter as separation area is formed of the same oxidation-reduction substance as used for other adjacent elements, so that the insulating matter has a good affinity for the other elements.

Although the aforementioned embodiment has shown the case where cytochrome c3 used as protein which can be inactivated to form an insulating matter, other types of natural proteins, such as heme iron-sulfur proteins, cytochrome b protein, cytochrome a, flavodoxin, plastocyanine, thioredoxin and the like, may be used. Further, other substances prepared by maintaining the active center structure of electron-transport proteins prevent in nature and by modifying the other structure thereof may by used. In other words, pseudo-electron-transport proteins prepared through modification or denaturation of the structure of amino-acid in electron-transport proteins present in nature by replacing the functional group such as a methyl group with another functional group or by other means, may be used, Further, pseudo-electron-transport proteins composed of a low-molecular oxidation-reduction substrate and an organic high-molecular chain may be used, viz, pseudo-electron-transport proteins composed of flavine mononucleotide and polyglutamic acid, and pseudo-electron-transport proteins composed of porphyrin and polystyrene. Further, other substances prepared by combination of a low-molecular oxidation-reduction substrate and a low-molecular organic matter having no oxidation-reduction function may be used, viz, substances prepared by combination of flavine mononucleotide and cyclodextran, and substances prepared by combination of porphyrin and stearic acid. Further, organic molecules or organometallic complex molecules synthesized to imitate such functions of electron-transport proteins present in nature may be used, viz, polymers, substances having $\pi$-electrons, and substances prepared by chemically binding substances subject to oxidation and reduction.

Figure 9A:
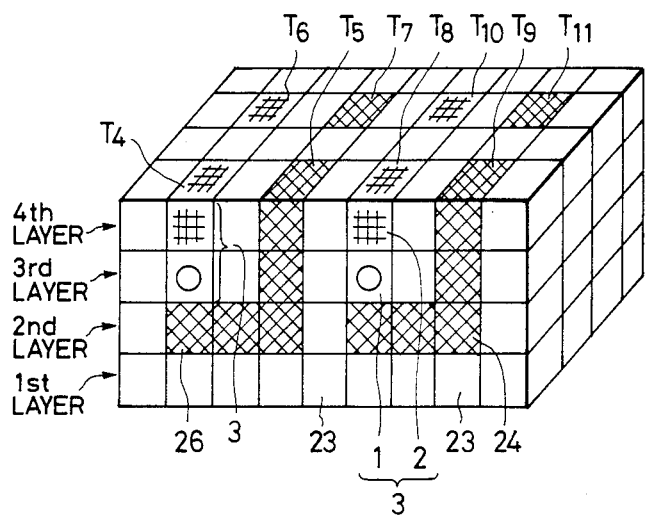
FIG. 9(A) is a typical view showing a redox electric element circuit according to a further embodiment of the present invention.
Figure 9B:
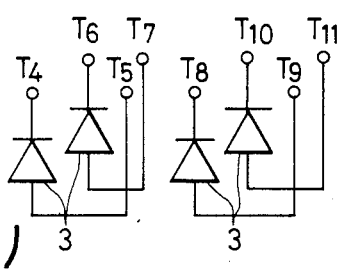
FIG. 9(B) is a circuit diagram equivalent to the redox electric element circuit as shown in FIG. 9(A)

FIG. 9(A) shows a redox electric element circuit according to a further embodiment of the present invention. The same numeral in each of FIG. 9(A) and FIG. 7(C) refers to the same part. In this embodiment, eight terminals $T_4$ to $T_{11}$ of four rectifier elements 3 are in one plane (the upper surface shown in the drawing)through wirings. FIG. 9(B) shows a circuit equivalent to that of FIG. 9(A).

An example of the process for production of the circuit will be described hereunder.

First, a monomolecular film of cytochrome $c_3$ is established as a first layer, and then irradiated by an energy beam so that the cytochrome $c_3$ becomes inactive cytochrome $c_3$ (23). Next, a monomolecular film of cytochrome $c_3$ is formed on the first layer to establish a second layer, and then the cytochrome $c_3$ of the second layer is inactivated exclusive of the places where wirings will be arranged. Next, a third layer is established on the second layer, and then the cytochrome $c_3$ layer is inactivated exclusive of the places where wirings are arranged. Further, the inactive cytochrome $c_3$ in the places where cytochrome c will be arranged to form redox electric elements is removed by energy beam irradiation, and them the places are filled with cytochrome c (1). A fourth layer and a fifth layer are established in the same manner as described above, thus to attain a circuit of this embodiment.

According to the redox electric element circuit in the aforementioned structure, the positive and negative electrode terminals of rectifier elements within the integrated circuit can be led out to necessary positions, for example, positions on the upper surface shown in the drawing, by wirings of electron-transport protein capable of transporting electrons in all directions while the wirings are insulated by insulating protein. Accordingly, a circuit in which an arbitrary pattern is formed and then electrodes and the like are easily formed, can be attained. All members of this circuit, that is, rectifier elements, wirings and insulating matters are formed of protein, so that the elements are expected to have a good affinity for each other. Further, the elements are implemented in hyperfine size in molecular level, thus to attain a circuit of supser-high density and super-high speed.

Figure 10A:
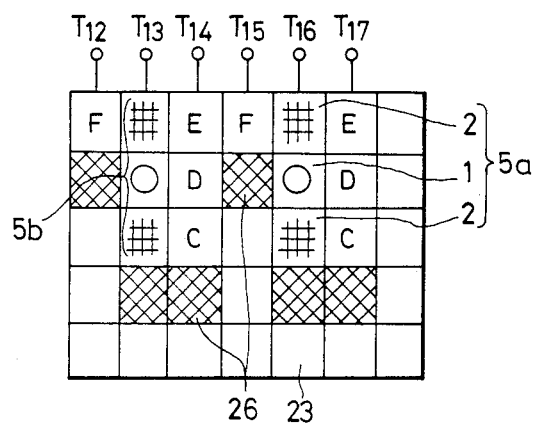
FIG. 10(A) is a typical view showing a redox electric element circuit according to a further embodiment of the present invention.
Figure 10B:
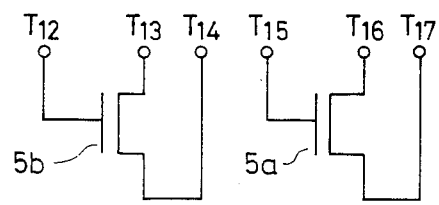
FIG. 10(B) is a circuit diagram equivalent to the redox electric element as shown in FIG. 10(A).

FIG. 10(A) shows a redox electric element circuit according to a still further embodiment of the present invention. The same numeral in each of this and other drawings refers to the same or similar part. In the drawing, $T_{12}$ to $T_{17}$ represent terminals, and C, D, E and F represent electron-transport protein molecules which are different in redox potential from each other and have electron transport functions for carrying electrons in predetermined directions. Of these, the redox potential relation of C, D and E can be expressed by monotonous increases of $C<D<E$. In reverse view, it is considered that the relation can be expressed by monotonous decrease. FIG. 10(B) shows a circuit equivalent to that of FIG. 10(A).

In this embodiment, the electon-transport proteins C, D, E and F different in redox potential from each other are respectively connected to both flavodoxin 2 and cytochrome c (1) which respectively correspond to drains and gates of the switching elements 5a and 5b, through cytochrome $c_3$ having electron transport function for carrying electrons in all directions, whereby respective lead wires for the drawings and gates are formed to establish respective terminals thereof in one plane. In the thus formed circuit, the electron-transport protein F and the wirings for connecting the proteins C, D and E to each other are in a specific arrangement so that a current can flow in only one direction according to the redox potential difference. Accordingly, the wirings can be insulated from adjacent switching elements and the like. Thus, a more miniaturized circuit is which an insulating matter is saved can be attained.

As described above, the redox electric element circuit employing oxidation-reduction substance according to the present invention includes insulating matters which are formed of oxidation-reductin substance inactivated by energy beam irradiation and which are arranged in at least one place between redox electric elements, between redox electric elements and wirings and between wirings. Accordingly, wirings and element separation structure can be attained in molecular level with maintaining affinity for redox electric elements. As this result, the present invention has the effect that an integrated circuit of super-high density can be put into practice.

What is claimed is:

1. A redox electric element circuit comprising: a plurality of redox electric elements formed by using oxidation-reduction substance; a plurality of electrodes connected to said electric elements; wirings arranged in at least one of places between said electric elements and between said electric elements and said electrodes, said wirings being formed of oxidation-reduction substances; and insulating matters arranged in at least one of places between said electric elements, between said electric elements and said wirings and between said wirings, said insulation matters being formed of oxidation-reduction substance inactivated by irradiation of an energy beam.

2. A redox electric element circuit according to claim 1, wherein said energy beam is selected from an electron beam, as ion beam, an elementary particle beam, a molecular beam, a gamma-ray beam, an X-ray beam and an ultraviolet beam.

3. A redox electric element circuit according to claim 1, wherein said oxidation-reduction substance is electron-tansport protein.

4. A redox electric element circuit according to claim 1, wherein said oxidation-reduction substance is pseudo-electron -transport protein.

5. A redox electric element circuit according to claim 4, wherein said pseudo-electron-transport protein is composed of a low-molecular oxidation-reduction substrate and an organic high-molecular chain.

6. A redox electric element circuit according to claim 1, wherein said oxidation-reduction substance is prepared by binding a low-molecular oxidation-reduction substrate and a low-molecular organic material having no oxidation-reduction function.

7. A redox electric element circuit according to claim 1, wherein said plurality of redox electric elements comprise electron-transport matter capable of transporting electrons in a predetermined direction.

8. A redox electric element circuit according to claim 1, wherein said wirings of oxidation-reduction substance are formed by arranging electron-transport protein capable of transporting electrons in a predetermined direction so that the redox potential of said electron-transport protein monotonously increases or decreases.

9. A redox electric element circuit according to claim 1, wherein said wirings of oxidation-reduction substance are formed by using electron-transport protein capable of transporting electrons in all directions.

10. A redox electric element circuit according to claim 1, wherein said insulating matters of oxidation-reduction substance are formed by inactivating electron-transport protein capable of transporting electrons in all directions.

11. A redox electric element circuit according to claim 10, wherein said electron-transport protein comprises cytochrome $c_3$.

12. A method of producing a redox electric element circuit comprising the steps of:

forming a first wiring layer comprising a first conductive protein film capable of transporting electrons in all directions on a substrate;

exposing a first part of said first wiring layer to energy beam and inactivating the conductivity of said first part of said first wiring layer, thereby forming a first insulating part in said first wiring layer;

forming on said first wiring layer a redox electric element layer comprising oxidation-reduction substance;

forming a second wiring layer compridng a second conductive protein film capable of transporting electrons in all directions on said redox element layer; and exposing a second part of said second wiring layer to energy beam and inactivating the conductivity of said second part of said second wiring layer ,thereby forming a second insulating part in said second wiring layer.

13. A method according to claim 12, wherein said oxidation-reduction substance comprises electron-transport matter capable of transporting electrons in a predetermined direction.

14. A method according to claim 13, wherein said electron-transport matter comprises one of electron-transport protein and pseudo-electron-transport protein.

15. A method according to claim 14, wherein said pseudo-electron-transport protein is substantially composed of a low-molecular oxidation-reduction substrate and an organic high-molecular chain.

16. A method according to claim 12, wherein said first and second conductive protein are composed of one of a group consisting of cytochrome $c_3$, heme iron-sulfur protein, cytochrome b, cytochrome a, flavodoxin, plastocyanine, and thioredoxin.

* * * * *